(12) United States Patent
Cheng et al.

(10) Patent No.: US 7,518,866 B2
(45) Date of Patent: Apr. 14, 2009

(54) HOST UNIT CASE FOR A COMPUTER WITH FOLDABLE HOLDING POSTS AT FRONT AND REAR WALLS THEREOF

(75) Inventors: Sheng-Hsiung Cheng, Taipei Hsien (TW); Te-An Lin, Taipei Hsien (TW); Wu-Nan Wang, Taipei Hsien (TW); Chia-Chia Huang, Taipei Hsien (TW)

(73) Assignee: AOPEN Inc., Hsichih (TW)

( * ) Notice: Subject to any disclaimer, the term of this patent is extended or adjusted under 35 U.S.C. 154(b) by 196 days.

(21) Appl. No.: 11/730,023

(22) Filed: Mar. 29, 2007

(65) Prior Publication Data

US 2007/0253155 A1 Nov. 1, 2007

(30) Foreign Application Priority Data

Apr. 26, 2006 (TW) .............................. 95114989 A (51) Int. Cl.
*G06F 1/16* (2006.01)
(52) U.S. Cl. .................... 361/697; 312/350; 312/223.2; 174/50

(58) Field of Classification Search ................. 361/679; 312/223.2, 350; 174/50
See application file for complete search history.

(56) References Cited

U.S. PATENT DOCUMENTS

| 4,561,706 A * | 12/1985 | Grati | 312/258 |
| 5,931,550 A * | 8/1999 | Chen | 361/683 |
| 6,382,744 B1 * | 5/2002 | Xiao | 312/223.2 |
| 2005/0040740 A1 * | 2/2005 | Yun | 361/683 |
| 2006/0215358 A1 * | 9/2006 | Campbell | 361/683 |

* cited by examiner

*Primary Examiner*—Lisa Lea-Edmonds (57) ABSTRACT

A host unit case for a computer with foldable holding posts at front and rear walls thereof provides an upper cover and a lower cover to pivotally connect with a front wall, a rear wall, first holding posts, second holding posts, third holding posts and fourth holding posts respectively as a main structure. The main structure is extended to form a firm structure such that the host unit case is capable of being set up conveniently and quickly and is folded conveniently to reduce the volume thereof during being packaged.

13 Claims, 8 Drawing Sheets

HOST UNIT CASE FOR A COMPUTER WITH FOLDABLE HOLDING POSTS AT FRONT AND REAR WALLS THEREOF

BACKGROUND OF THE INVENTION

1. Field of the Invention

The present invention is related to a host unit case of a personal computer and particularly to a built-up type host unit case of a computer.

2. Brief Description of Related Art

The host unit case is employed to receive electronic devices such as a main board, hard disks, optical disk drives, floppy disk drives and power supply device. Usually, the host unit case is set up with an unchangeable structure. The composite type host unit case has such as U.S. Pat. No. 6,961,236, which discloses a computer chassis, and Taiwan patent publication No. M258544, which discloses a host unit case accommodating ATX and BTX specifications.

Following prior art is belonged to a further type for the host unit case is made available for being disassembled into several parts before being set up as the host unit case. Taiwan Patent Publication Nos. 468811 discloses a host unit case for an industrial computer. Taiwan Patent Publication No. 490120 discloses a composite computer chassis. Taiwan Patent Publication No. 474423 discloses a computer chassis free from aid of hand tools. Taiwan Patent Publication No. 490120 discloses a composite type computer chassis. Taiwan Patent Publication No. 531142 discloses a composite type computer chassis assembly.

Further, the computer chassis free from aid of hand tools disclosed in Taiwan Patent Publication No. 474423 provides the front and rear cover plates, which are pivotally joined to a bottom plate with head pins, two frame plates for a big floppy disk drive, which are pivotally joined to the front and rear cover plates, and a cover plate for a small floppy disk drive is assembled to a frame plate and is fixedly hung to the bottom of frame plate for the big floppy disk drive. Further, four L shaped plates are fixed at four corners of the bottom plate to be joined to the two cover plates firmly. Finally, two lateral cover plates are hooked to the lateral sides of the preceding structure and fastened with set screws after the main board and the power supply frame being mounted to the preceding structure to complete the whole assembly of the computer chassis. The parts of the computer chassis are packaged separately such that less space is required for storage.

However, parts of the preceding prior art are so many and divided into several part groups and it is inconvenient to pick right parts during setting up the computer chassis such that it is hard to gather the parts before assembling and it takes a lot of time to set up the computer chassis.

SUMMARY OF THE INVENTION

The crux of the present invention is to develop a host unit case, which is capable of being folded and set up more conveniently for being favorable for reduction of delivery cost and economy of storage space.

The primary object of the present invention is to provide a host unit case for a computer with foldable holding posts at front and rear walls thereof with which the host unit case can be set up completely, easily and quickly to enhance fun while the host unit case being set up by the user.

Another object of the present invention is to provide a host unit case for a computer with foldable holding posts at front and rear walls thereof with which the parts can be gathered together and reduced to a small volume while being packaged such that it is capable of lowering delivery cost and saving storage space.

Accordingly, a host unit case for a computer with foldable holding posts at front and rear walls thereof with which a reduced volume of the host unit case is obtained while being folded packaged and convenience and quickness are reached while being set up as a firm structure, comprising:

a lower cover;

a front wall;

two first holding posts;

two second holding posts, corresponding to and pivotally connecting with the first holding posts respectively;

a rear wall;

two third holding posts;

two fourth holding posts; corresponding to and pivotally connecting with the third holding posts respectively; and an upper cover;

wherein, the second holding posts and the first holding posts are disposed at two lateral sides of the front wall respectively and the second holding posts and the front wall pivotally connect with the upper cover and the first holding posts pivotally connect with the lower cover; the fourth holding posts and the third holding posts are disposed at two lateral sides of the rear wall respectively and the third holding posts and the rear wall pivotally connect with the lower cover and the fourth holding posts pivotally connect with the upper cover;

whereby, the upper cover, the lower cover, the front wall, the first holding posts, the second holding posts, the rear wall, the third holding posts and the fourth holding posts are capable of being extended to form a firm structure such that the host unit case is set up completely, easily and quickly and is folded conveniently to reduced the volume thereof during being packaged.

BRIEF DESCRIPTION OF THE DRAWINGS

The present invention can be more fully understood by reference to the following description and accompanying drawings, in which.

DETAILED DESCRIPTION OF THE INVENTION

Figure 1:
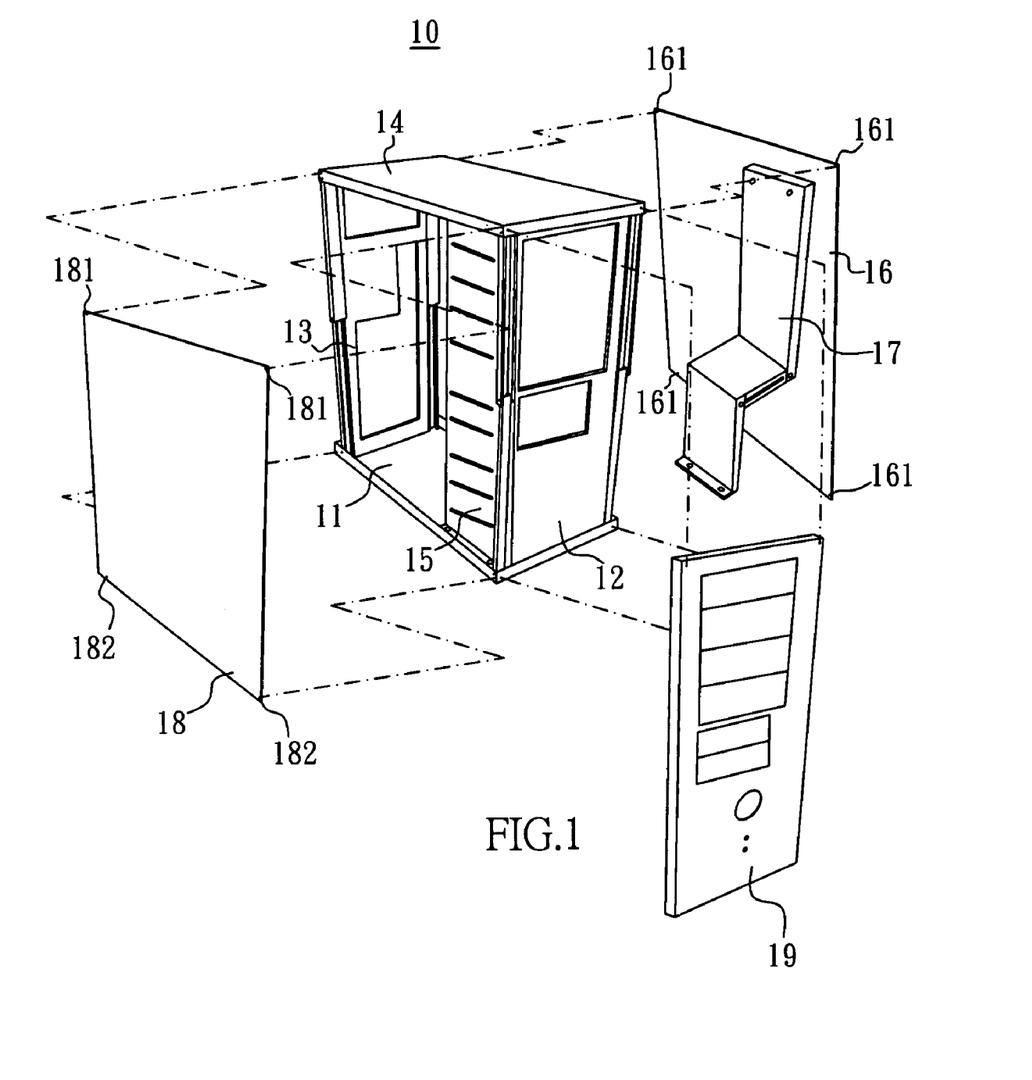
FIG. 1 is an exploded perspective view of an embodiment of a host unit case for a computer with foldable support posts at front and rear walls thereof according to the present invention.
Figure 2:
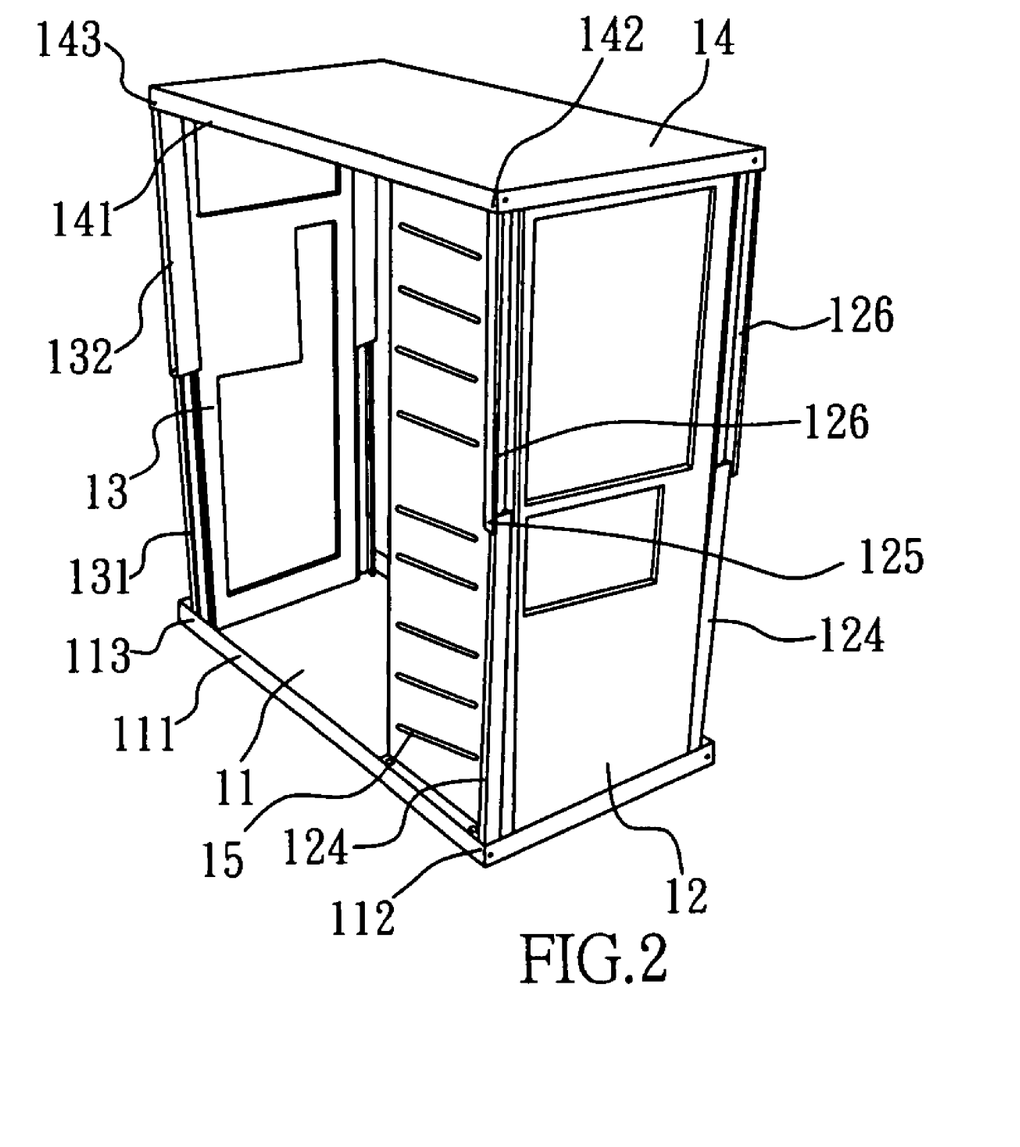
FIG. 2 is a perspective view illustrating the main structure of the embodiment of the present invention.
Figure 3:
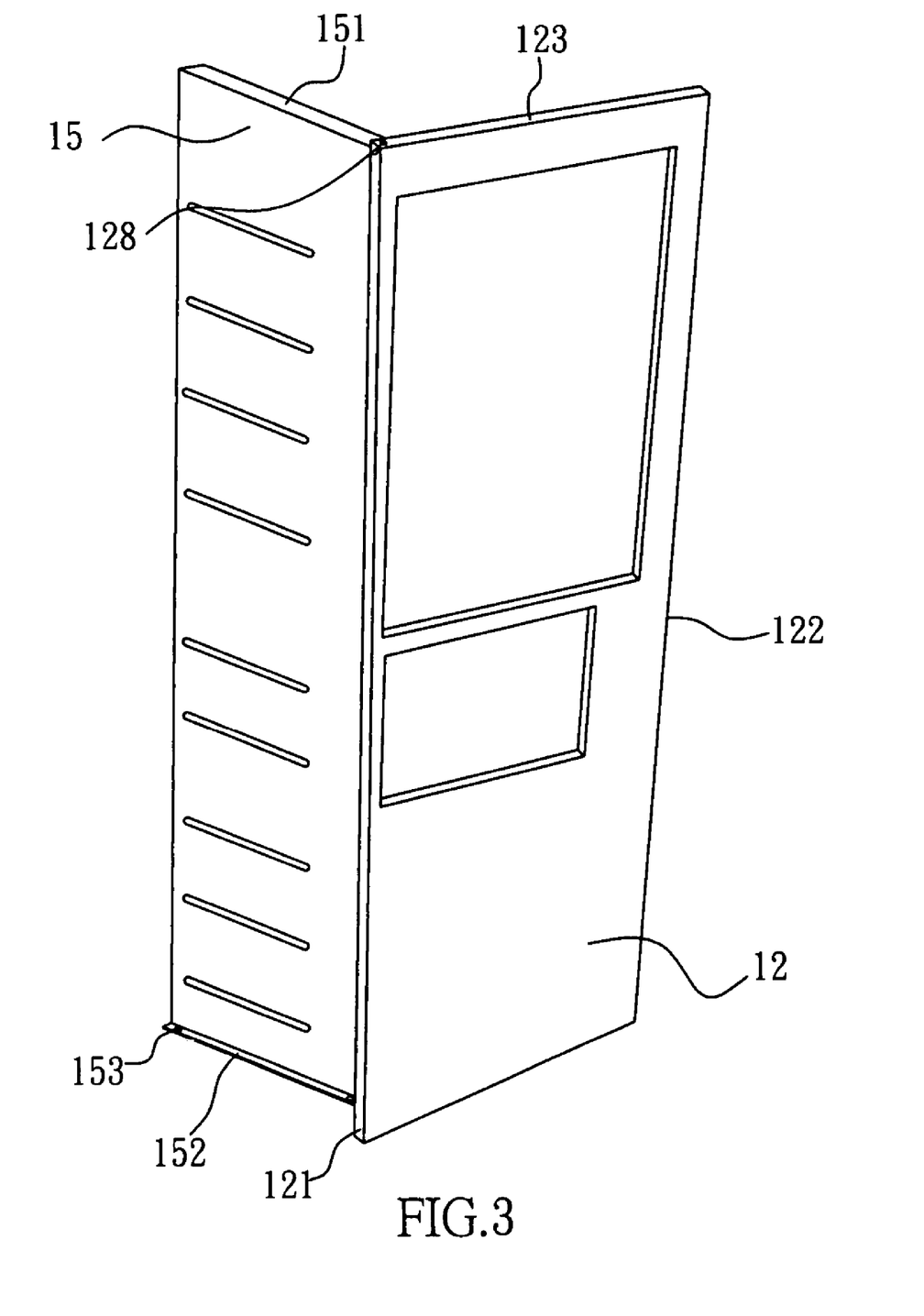
FIG. 3 is a perspective view illustrating the front wall is associated with a first holding frame in the embodiment of the present invention.
Figure 4A:
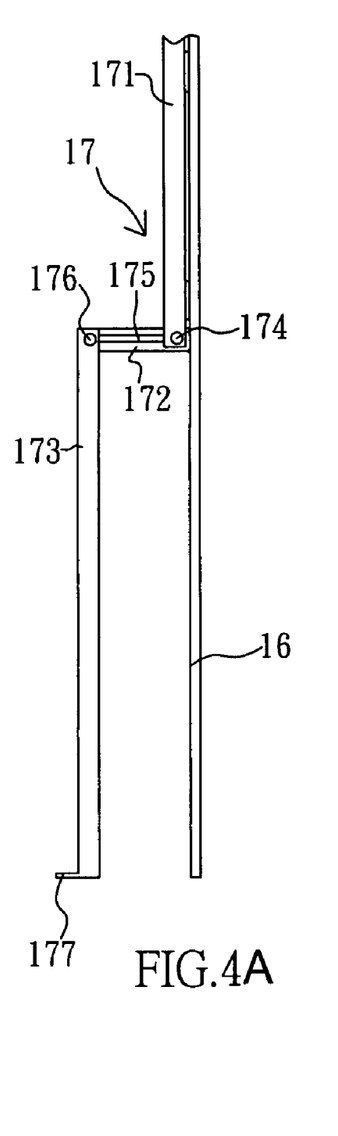
FIGS. 4A, 4B and 4C are side elevational views illustrating steps for folding a first side wall and a second holding frame in the embodiment of the present invention.
Figure 4B:
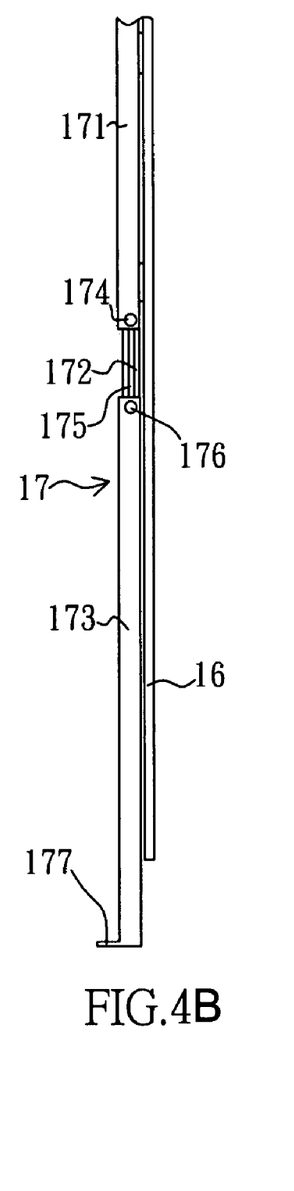
Figure 4C:
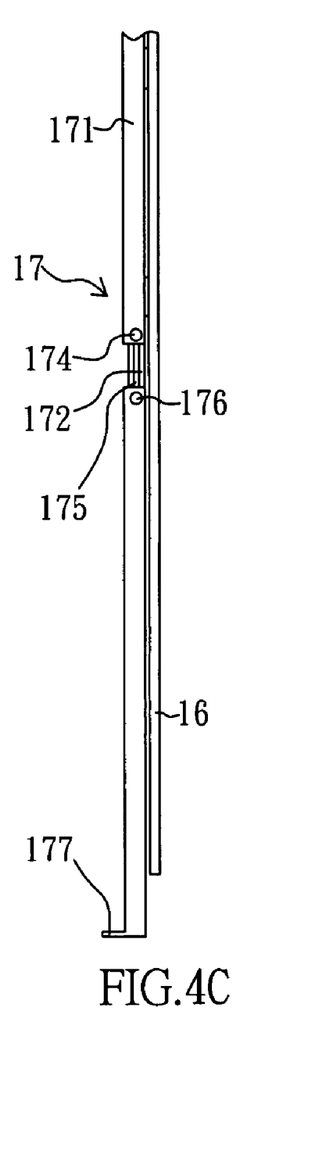

Referring to FIGS. 1, 2, 3, 4A, 4B and 4C, an embodiment of a host unit case for a computer with foldable front and rear walls according to the present invention is capable of being reduced volume thereof for packaging and being completely set up conveniently and quickly. The host unit case 10 includes:

a lower cover 11, which provides a frame edge 111 extending upward with a fitting hole at two ends of the frame edge 111;

a front wall 12, which has frame edges 121, 122 at the left and right lateral sides thereof respectively to correspond to the frame edge 111 and has a frame edge 123 at the upper and lower sides thereof respectively as shown in FIG. 3;

two first holding posts 124 as shown in FIG. 2;

two second holding posts 126, which have an end to pivotally connect with the first holding posts 124 with a pivot 125 respectively;

a rear wall 13, which has a frame edge with a fitting hole at the left and right lateral sides thereof respectively to correspond to the frame edges 111, 112 of the lower cover 11;

two third holding posts 131, which are disposed at two lateral sides of the rear wall 13 and have a second end located at the inner side of the frame edge 111 respectively with the respective second end providing a fitting hole corresponding to the fitting hole of frame edges of the rear wall 13 and the fitting hole of frame edge 111, the lower cover 11, the third holding posts 131 and rear wall 13 pivotally connecting with each other by means of a pivot 113 passing through the corresponding fitting holes as shown in FIG. 2;

two fourth holding posts 132, which pivotally connect with the third holding posts 131 in the same way as the second holding posts 126 pivotally connects with the first holding posts 124;

an upper cover 14, which provides a frame edge 141 extending downward for another end of the respective second holding post 126 being disposed at the inner side of the frame edge 141, wherein, the frame edge 141 has fitting holes corresponding to fisting holes at the second holding posts 126 and the front wall 12 for the second holding posts 126 and the front wall 12 pivotally connect with the upper cover 14 with a pivot 142 passing through the fitting holes, and the upper cover 14 has fitting holes corresponding to fitting holes of the fourth holding posts 132 for the fourth holding posts 132 pivotally connecting with the upper cover 14 with a pivot 143 respectively;

a first support frame 15, which has a strip member 151, 152 at the upper and lower ends thereof as shown in FIG. 3 to be disposed at the inner side of a frame edge 123 at the upper and lower ends of the front wall 12, wherein, the strip members 151, 152 and the frame edge 123 have fitting holes corresponding to each other such that strip members 151, 152 are capable of pivotally connecting with the frame 123 with a pivot 128 respectively in a way of an end of the first support frame 15 being pivotally joined to the second end of the front wall 12 and another end of the first support frame 15 being movably attached to the first end of the front wall 12, and the strip member 152 have fitting holes 153 corresponding to fitting holes at the lower cover 11 such that when the first support frame 15 is lifted, the lower end of the first support frame 15 is secured to the lower cover 11 with screws passing through the corresponding holes 153;

a first lateral wall 16, which has fitting holes 161 corresponding to the upper and lower covers 14, 11 respectively for being fixedly joined to the upper and lower covers 14, 11 with screws passing through the fitting holes 161 as shown in FIG. 1.

a second support frame 17, which is composed of a first plate 171, a second plate 172 and a third plate 173 pivotally connecting with each other sequentially as shown in FIGS. 1 and 4A to 4C, wherein, the first plate 171 is joined at the inner side of the first lateral wall 16 with the lower end of the first plate 171 pivotally connecting with second plate 172 with a first pivotal shaft 174 and the upper end of the third plate 173 pivotally connecting with an elongated groove 175 of the second plate 172 by means of a second pivotal shaft 176 such that the third plate 173 is capable of extending to approach the first support frame 15 or folding to close to the first lateral wall 16 for both the second plate 172 and the third plate 173 being attached to the first lateral wall 16, and the third plate 173 is capable of moving closer to the first plate 171 due to the second pivotal shaft 176 moving along the elongated groove 175 as shown in FIGS. 4B and 4C; the lower end of the third plate 173 has a strip member 177 with fitting holes corresponding to fitting holes at the lower cover 11 such that the lower end of the third plate 173 is capable of being fixedly joined to the lower cover 11 by means of screws passing through the corresponding fitting holes;

a second lateral wall 18, which has fitting holes 181, 182 corresponding fitting holes at the upper cover 14 and the lower cover 11 such that the second lateral wall 18 is capable of fixedly joined to the upper cover 14 and the lower cover 11 by means of screws passing through the corresponding fitting holes; and a front panel 19, which has locking lugs corresponding to engaging holes at the upper cover 14 and the lower cover 11 for the front panel 19 being fixedly joined to the upper cover 14 and the lower cover 11 by means of locking lugs engaging with the corresponding engaging holes.

Referring to FIGS. 1 to 3 and 4A to 4C, the front wall 12, the rear wall 13, the first holding posts 124, the second holding posts 126, the third holding posts 131 and the fourth holding posts 132 pivotally connect with the upper cover 14 and the lower cover 11 respectively to constitute the main structure of host unit case 10. When the host unit case 10 is packaged, the front panel 19, the first lateral wall 16 and the second lateral wall 18 separated from the main structure and then the first support frame 15 leans against the front wall 12, the front wall 12 leans against the upper cover 14, the rear wall 13 leans against the lower cover 11, the second holding posts 126 and the first holding posts 124 lean against the upper cover 14 and the lower cover 11 respectively, and the fourth holding posts 132 and the third holding posts 131 lean against the upper cover 14 and the lower cover 11 respectively. Finally, the upper cover 14 leans against the lower cover 11 to form a state of being folded completely so as to reduce the space occupied by the folded host unit 10 largely.

Figure 5:
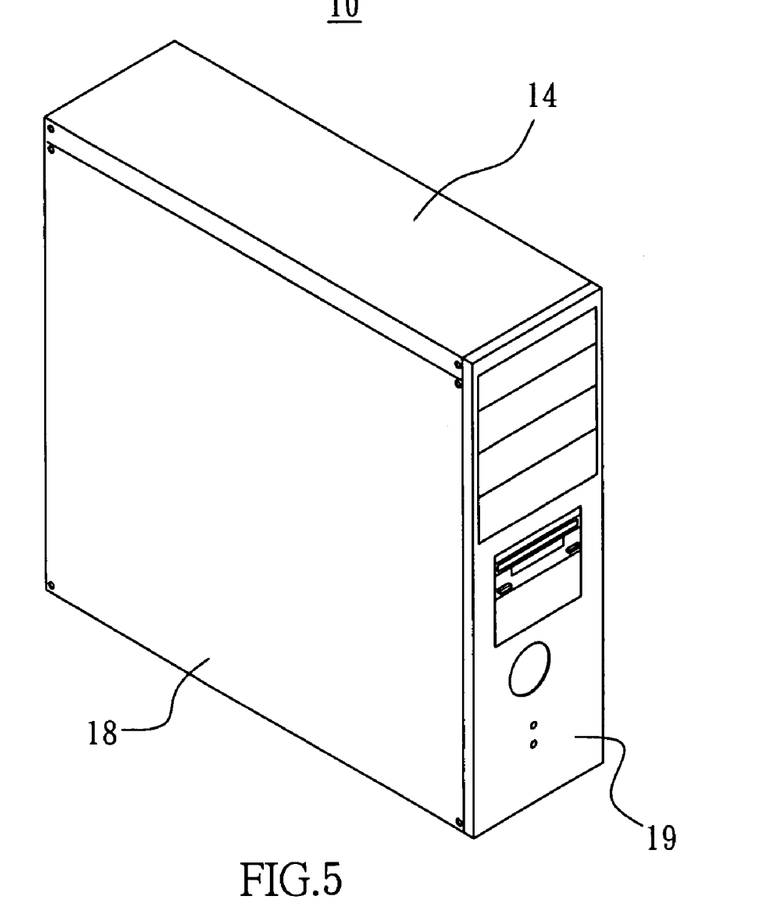
FIG. 5 is a perspective view illustrating the host unit of the embodiment of the present invention in a state of being fully unfolded.
Figure 6A:
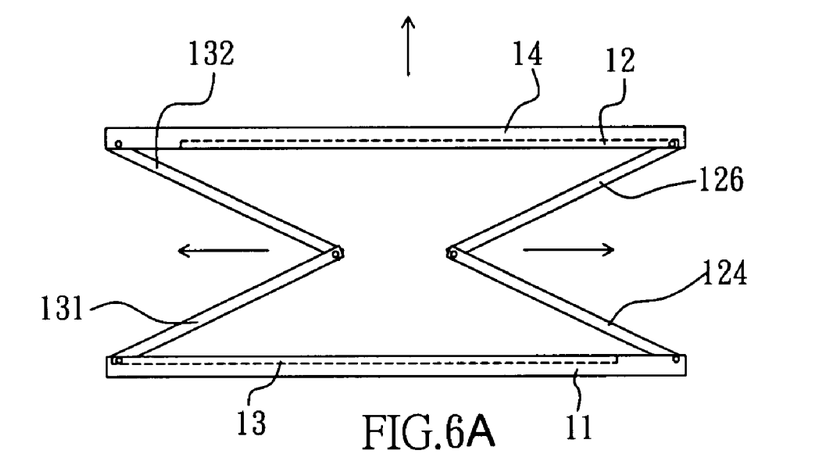
FIGS. 6A to 6G are side elevational views illustrating steps for unfolding the main structure of the host unit in the embodiment of the present invention.
Figure 6B:
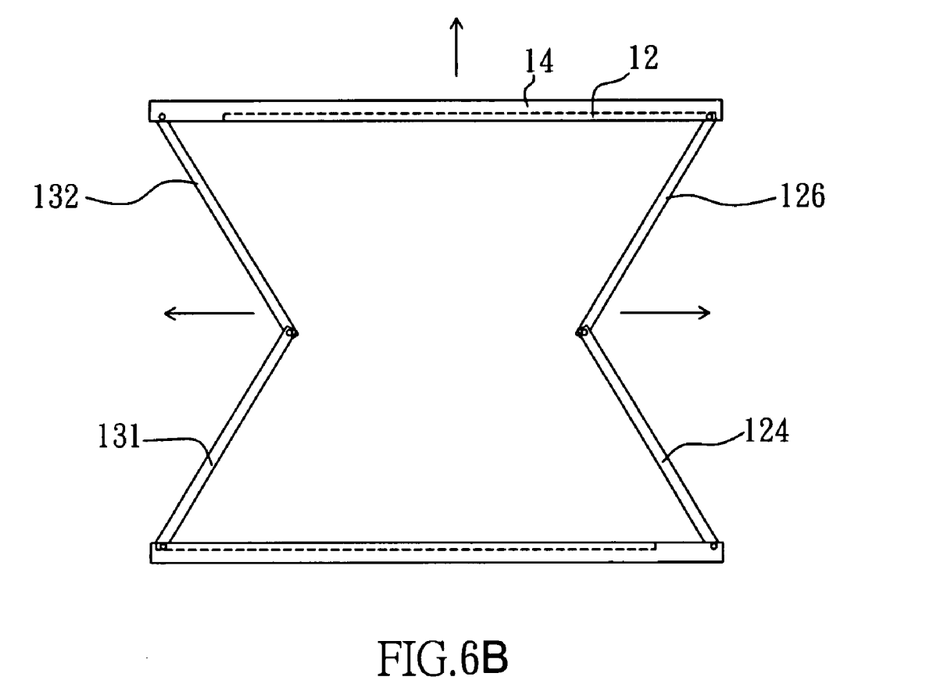
Figure 6C:
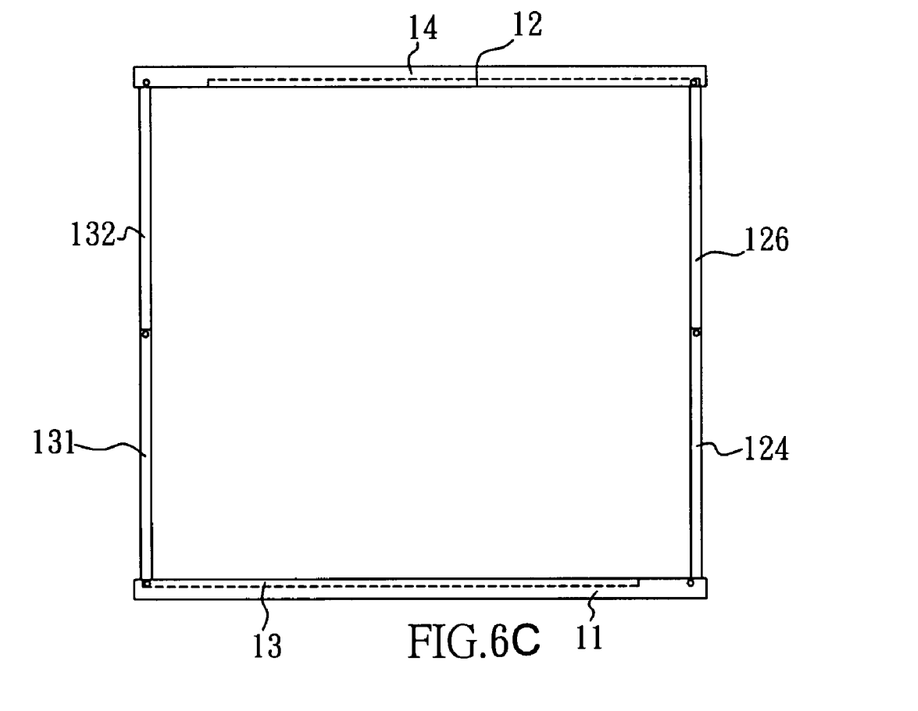
Figure 6D:
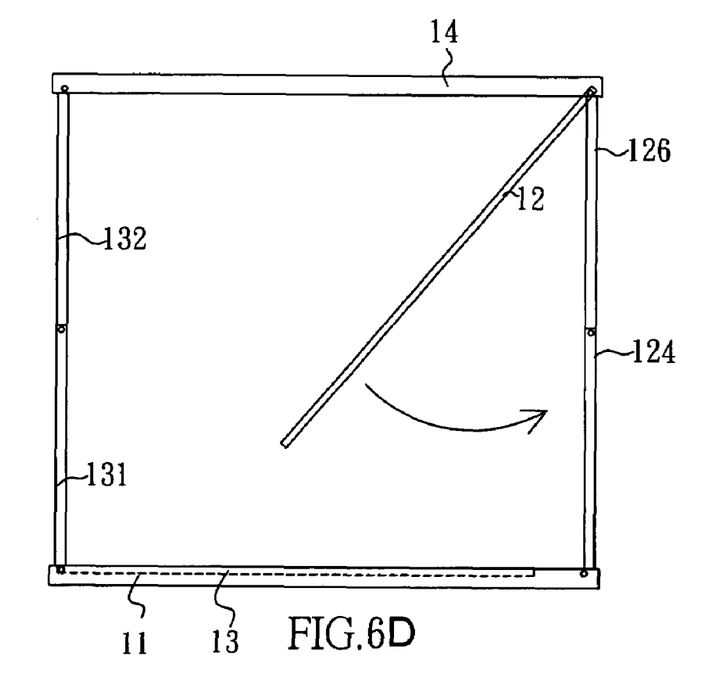
Figure 6E:
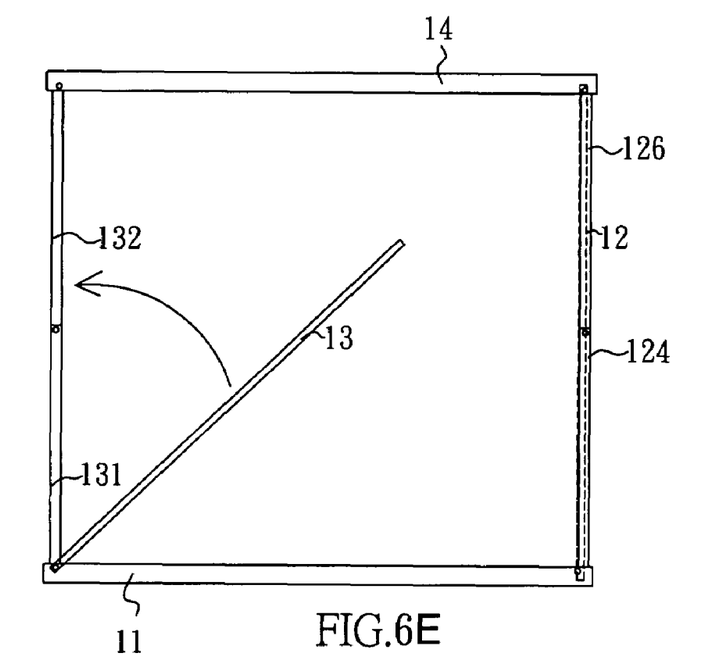
Figure 6F:
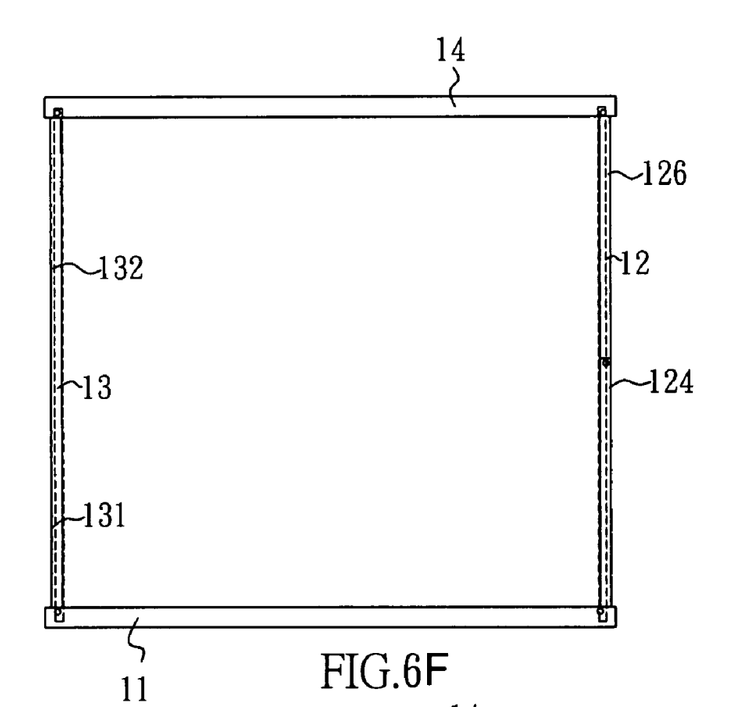
Figure 6G:
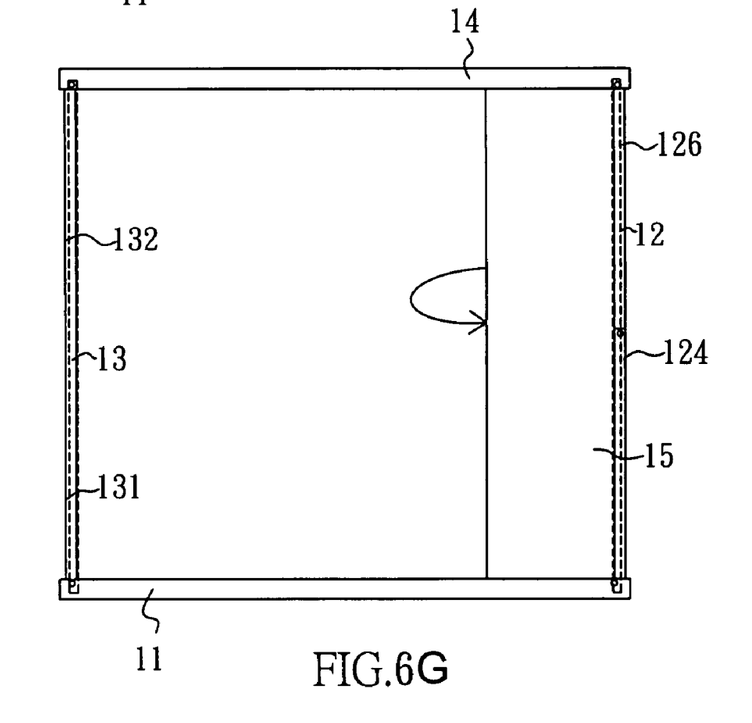

Referring to FIGS. 1 to 2, 5 and 6A to 6G, when the host unit 10 is extended, the upper cover 14 and the lower cover 11 are moved upward and downward respectively first to allow the pivotal joints between the first holding posts 124 and pivotal joints between the second holding posts 126 move frontward and pivotal joints between the third holding posts 131 and pivotal joints between the fourth holding posts 132 move backward as shown in FIGS. 6A and 6B till the holding posts 124, 126, 131, 132 being fully extended as shown in FIG. 6C. Then, the front wall 12 and the rear wall 13 are lifted as shown in FIGS. 6D and 6E to allow the lower end of the front wall 12 leans against the lower cover 11 and the upper end of the rear wall 13 leans against the upper cover 14 as shown in FIG. 6F, the first support frame 15 is lifted as shown in FIG. 6G, the first support frame 15 is fixedly joined to the lower cover 11 and the first lateral wall 16, the second lateral wall 18 and the front panel 19 are fixedly joined to the upper cover 14 and the lower cover 11 respectively. Finally, the second support frame 17 is extended to form a fully extended host unit as shown in FIG. 5.

The first support member 15 spaces apart the first plate 171 of the second support member 17 a longer distance for being associated with first electronic device such as 5.25" disk drive and the first support member 15 spaces apart the third plate 173 of the second support member 17 a shorter distance for being associated with second electronic device such as 3.25" disk drive.

It is appreciated that the host unit case for a computer with foldable front and rear walls according to the present invention is capable of being set up a complete host unit case easily and quickly to enhance fun with self setting up the host unit case and be favorable for decreasing delivery cost and saving available storage space.

While the invention has been described with referencing to a preferred embodiment thereof, it is to be understood that modifications or variations may be easily made without departing from the spirit of this invention, which is defined by the appended claims.

What is claimed is:

1. A host unit case for a computer with foldable holding posts at front and rear walls thereof with which a reduced volume of the host unit case is obtained while being folded packaged and convenience and quickness are reached while being set up as a firm structure, comprising:
   a lower cover;
   a front wall;
   two first holding posts;
   two second holding posts, corresponding to and pivotally connecting with the first holding posts respectively;
   a rear wall;
   two third holding posts;
   two fourth holding posts; corresponding to and pivotally connecting with the third holding posts respectively; and
   an upper cover;
   wherein, the second holding posts and the first holding posts are disposed at two lateral sides of the front wall respectively and the second holding posts and the front wall pivotally connect with the upper cover and the first holding posts pivotally connect with the lower cover; the fourth holding posts and the third holding posts are disposed at two lateral sides of the rear wall respectively and the third holding posts and the rear wall pivotally connect with the lower cover and the fourth holding posts pivotally connect with the upper cover;
   whereby, the upper cover, the lower cover, the front wall, the first holding posts, the second holding posts, the rear wall, the third holding posts and the fourth holding posts are capable of being extended to form a firm structure.

2. The host unit case for a computer with foldable holding posts at front and rear walls thereof as defined in claim 1, wherein the lower cover has a frame edge extending upward; the frame edge and the first holding posts have holes corresponding to each other for the first holding posts pivotally connect with a front end of the lower cover by means of pivots passing through the corresponding holes; the upper cover has a frame edge extending downward; the front wall has a frame edge at two lateral sides thereof; the frame edge of the upper cover, the frame edge of the front wall and the second holding posts have holes corresponding to each other for an upper side of the front wall and the second holding posts pivotally connect with a front side of the upper cover by means of pivots passing through the corresponding holes.

3. The host unit case for a computer with foldable holding posts at front and rear walls thereof as defined in claim 2, wherein two lateral walls of the rear wall have a frame edge; the frame edge of the lower cover, the frame edge of the rear wall and the third holding posts have holes corresponding to each other for a lower side of the rear wall and the third holding posts pivotally connecting with a rear side of the lower cover respectively by means of pivots passing through the corresponding holes; the frame edge of the upper cover and the fourth holding posts have holes corresponding to each other for the fourth holding posts pivotally connecting with a rear side of the upper cover respectively by means of pivots passing through the corresponding holes.

4. The host unit case for a computer with foldable holding posts at front and rear walls thereof as defined in claim 3, wherein the second holding posts and the first holding posts pivotally connect with each other by means of pivots and the fourth holding posts and the third holding posts pivotally connect with each other by means of pivots.

5. The host unit case for a computer with foldable holding posts at front and rear walls thereof as defined in claims 1, wherein a second end of the front wall pivotally connects with an end of a first support frame.

6. The host unit case for a computer with foldable holding posts at front and rear walls thereof as defined in claim 5, wherein the upper and lower side of the front wall have a frame edge; the first support frame has a strip member at the upper and lower ends thereof; the strip members of the first support frame and the frame edge of the front wall have holes corresponding to each other for the first support frame and the front wall pivotally connect with each other by means of pivots passing through the holes.

7. The host unit case for a computer with foldable holding posts at front and rear walls thereof as defined in claim 6, wherein the strip members of the first support frame at the lower end thereof has holes corresponding to holes at the lower cover for the lower end of the first support frame being attached to the lower cover by means of pivots passing through the holes.

8. The host unit case for a computer with foldable holding posts at front and rear walls thereof as defined in claim 5, further comprises a first lateral wall to be attached to the upper cover and the lower cover respectively.

9. The host unit case for a computer with foldable holding posts at front and rear walls thereof as defined in any of claim 8, further comprises a second support frame, which is composed of a first plate, a second plate and a third plate pivotally connecting with each other sequentially; the first plate is joined to the inner side of the first lateral wall; a lower end of the first plate is joined to an end of the second plate; an upper end of the third plate is joined to another end of the second plate; the third plate is closer to the first support frame than the first plate for a first electronic device being capable of being placed between the first support frame and the first plate and a second electronic device is capable of being placed between the first support frame and the third plate.

10. The host unit case for a computer with foldable holding posts at front and rear walls thereof as defined in claim 9, wherein a lower end of the first plate pivotally connects with the second plate with a first pivotal shaft and an upper end of the third plate pivotally connects with an elongated groove of the second plate with a second pivotal shaft for the third plate being capable of extending toward the first support frame.

11. The host unit case for a computer with foldable holding posts at front and rear walls thereof as defined in claim 9, wherein a lower end of the third plate has a bent strip member and the strip member has holes corresponding to holes at the lower cover for the lower end of the third plate being attached to the lower cover by means of screws passing through the corresponding holes.

12. The host unit case for a computer with foldable holding posts at front and rear walls thereof as defined in claim 8, further comprises a second lateral wall and the second lateral wall has holes corresponding to holes at the front wall and rear wall for the second lateral wall being attached to the front wall and the rear wall respectively by means of screws passing through the corresponding holes.

13. The host unit case for a computer with foldable holding posts at front and rear walls thereof as defined in claim 12 further comprises a front panel to be joined to the upper cover and the lower cover respectively.

* * * * *